US010668832B2

(12) United States Patent
Capati et al.

(10) Patent No.: US 10,668,832 B2
(45) Date of Patent: Jun. 2, 2020

(54) TEMPERATURE CONTROL APPARATUS FOR ELECTRIC VEHICLE BATTERY PACKS

(71) Applicant: SF Motors, Inc., Santa Clara, CA (US)

(72) Inventors: Nathalie Capati, Santa Clara, CA (US); Duanyang Wang, Santa Clara, CA (US); Jacob Heth, Santa Clara, CA (US); Binbin Chi, Santa Clara, CA (US)

(73) Assignees: CHONGQING JINKANG NEW ENERGY VEHICLE CO., LTD., Chongqing (CN); SF MOTORS, INC., Santa Clara, CA (US)

(*) Notice: Subject to any disclaimer, the term of this patent is extended or adjusted under 35 U.S.C. 154(b) by 93 days.

(21) Appl. No.: 16/118,363

(22) Filed: Aug. 30, 2018

(65) Prior Publication Data
US 2019/0077276 A1    Mar. 14, 2019

Related U.S. Application Data

(60) Provisional application No. 62/557,682, filed on Sep. 12, 2017.

(51) Int. Cl.
*B60L 58/26* (2019.01)
*H05K 7/20* (2006.01)
(Continued)

(52) U.S. Cl.
CPC ........... *B60L 58/26* (2019.02); *H01M 2/1077* (2013.01); *H01M 10/613* (2015.04);
(Continued)

(58) Field of Classification Search
CPC .......... H01M 10/6554; H01M 10/613; H01M 2200/10
See application file for complete search history.

(56) References Cited

U.S. PATENT DOCUMENTS

2010/0136391 A1* 6/2010 Prilutsky ............... H01M 10/63
429/62
2012/0263981 A1* 10/2012 Norden ............. A62C 99/0009
429/53
(Continued)

FOREIGN PATENT DOCUMENTS

WO    WO-2018184998 A1 * 10/2018 .......... H01M 10/613
WO    WO-2018185001 A1 * 10/2018 .......... H01M 10/613

*Primary Examiner* — Matthew J Merkling
(74) *Attorney, Agent, or Firm* — Foley & Lardner LLP

(57) ABSTRACT

Apparatuses, systems, and methods of controlling of an energy storage unit are detailed herein. A cold plate can be thermally coupled with an energy storage unit for powering the electric vehicle. The cold plate can have a bottom layer. The bottom layer can have a channel spanning across a top surface of the bottom layer to circulate coolant to transfer heat away from the energy storage unit. The top layer can be flush with a bottom surface of the energy storage unit. The top layer can define openings each extending between the top surface and the bottom surface. The cold plate can have inserts sealing the openings. The inserts can have a melting temperature lower than a melting temperature of the top layer to expose at least one opening when heated the melting temperature to allow release of the coolant from the channel onto the energy storage unit.

20 Claims, 10 Drawing Sheets

(51) Int. Cl.
*H01M 2/10* (2006.01)
*H01M 10/625* (2014.01)
*H01M 10/6554* (2014.01)
*H01M 10/6556* (2014.01)
*H01M 10/653* (2014.01)
*H01M 10/613* (2014.01)

(52) U.S. Cl.
CPC ....... *H01M 10/625* (2015.04); *H01M 10/653* (2015.04); *H01M 10/6554* (2015.04); *H01M 10/6556* (2015.04); *H05K 7/20254* (2013.01); *H05K 7/20272* (2013.01); *H05K 7/20872* (2013.01); *H01M 2200/10* (2013.01); *H01M 2220/20* (2013.01)

(56) References Cited

U.S. PATENT DOCUMENTS

| | | | | |
|---|---|---|---|---|
| 2012/0308854 | A1* | 12/2012 | Schaefer | H01M 6/5038 |
| | | | | 429/50 |
| 2016/0204483 | A1* | 7/2016 | Schilder | H01M 10/0525 |
| | | | | 429/50 |
| 2018/0191038 | A1* | 7/2018 | Li | H01M 10/613 |
| 2018/0358671 | A1* | 12/2018 | Halsey | H01M 10/0525 |

* cited by examiner

TEMPERATURE CONTROL APPARATUS FOR ELECTRIC VEHICLE BATTERY PACKS

CROSS-REFERENCES TO RELATED APPLICATIONS

This application claims priority under 35 U.S.C. § 119(e) to U.S. Provisional Application No. 62/557,682, titled "COLD PLATE DESIGN FOR BATTERY PACKS," filed Sep. 12, 2017, which is incorporated by reference in its entirety.

BACKGROUND

There is an increasing demand for reliable and higher capacity battery cells for high power, higher performance battery packs, to support applications in plug-in hybrid electrical vehicles (PHEVs), hybrid electrical vehicles (HEVs), or electrical vehicle (EV) systems, for example. The temperature of battery pack modules can increase under operating conditions.

SUMMARY

The present disclosure is directed to cold plates for battery packs in electric vehicles. The cold plate can include a top layer with inserts or braised areas that melt during a thermal runaway event, and a bottom layer with hollow channels to hold a coolant. Such a configuration allows for improvement in protection of the battery pack.

At least one aspect is directed to an apparatus to control temperature of electrical energy storage units in electric vehicles. The apparatus can include a cold plate disposed in an electric vehicle and thermally coupled with an energy storage unit for powering the electric vehicle. The cold plate can have a bottom layer. The bottom layer can have a channel spanning across a top surface of the bottom layer. The channel can circulate coolant to transfer heat away from the energy storage unit. The channel can have a first end and a second end both located toward a corner of the bottom layer. The cold plate can have a top layer. The top layer can cover the channel spanning across the top surface of the bottom layer. The top layer can have a surface at least partially flush with a bottom surface of the energy storage unit. The top layer can define a plurality of openings each extending between the top surface and the bottom surface. The cold plate can have a plurality of inserts. The plurality of inserts can seal the plurality of openings. The plurality of inserts can prevent the coolant in the channel from direct physical contact with the bottom surface of the energy storage units. The plurality of inserts can have a melting temperature lower than a melting temperature of the top layer. At least one of the plurality of inserts can melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

At least one aspect is directed to a method of controlling temperature of electrical energy storage units in electric vehicles. The method can include providing a cold plate in an electric vehicle to thermally couple with an energy storage unit for powering the electric vehicle. The cold plate can have a bottom layer. The bottom layer can have a channel spanning across a top surface of the bottom layer. The channel can circulate coolant to transfer heat away from the energy storage unit. The channel can have a first end and a second end both located toward a corner of the bottom layer. The cold plate can have a top layer. The top layer can cover the channel spanning across the top surface of the bottom layer. The top layer can have a surface at least partially flush with a bottom surface of the energy storage unit. The top layer can define a plurality of openings each extending between the top surface and the bottom surface. The cold plate can have a plurality of inserts. The plurality of inserts can seal the plurality of openings. The plurality of inserts can prevent the coolant in the channel from direct physical contact with the bottom surface of the energy storage units. The plurality of inserts can have a melting temperature lower than a melting temperature of the top layer. At least one of the plurality of inserts can melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

At least one aspect is directed to an electric vehicle. The electric vehicle can have one or more electric components. The electric vehicle can have a plurality of energy storage units for powering the one or more electric components. The electric vehicle can have a cold plate thermally coupled with each energy storage unit of the plurality of energy storage units. The cold plate can have a bottom layer. The bottom layer can have a channel spanning across a top surface of the bottom layer. The channel can circulate coolant to transfer heat away from the energy storage unit. The channel can have a first end and a second end both located toward a corner of the bottom layer. The cold plate can have a top layer. The top layer can cover the channel spanning across the top surface of the bottom layer. The top layer can have a surface at least partially flush with a bottom surface of the energy storage unit. The top layer can define a plurality of openings each extending between the top surface and the bottom surface. The cold plate can have a plurality of inserts. The plurality of inserts can seal the plurality of openings. The plurality of inserts can prevent the coolant in the channel from direct physical contact with the bottom surface of the energy storage units. The plurality of inserts can have a melting temperature lower than a melting temperature of the top layer. At least one of the plurality of inserts can melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

At least one aspect is directed toward a method. The method can include providing an apparatus to control electrical energy storage units in electric vehicles. The apparatus can include at least one cold plate disposed in an electric vehicle and thermally coupled with at least one energy storage unit. The energy storage unit (e.g., a battery pack) can power the electric vehicle. The cold plate can include a bottom layer having a channel spanning across a top surface of the bottom layer. The channel can circulate coolant to transfer heat away from the energy storage unit. The channel can have a first end and a second end both located toward a corner of the bottom layer. The cold pate can have a top layer to cover the channel spanning across the top surface of the bottom layer. The top layer can have a surface at least partially flush with a bottom surface of the energy storage unit and defining a plurality of openings each extending between the top surface and the bottom surface. The cold plate can include a plurality of inserts to seal the plurality of openings and to prevent the coolant in the channel from direct physical contact with the bottom surface of the energy storage units. The plurality of inserts can have a melting temperature lower than a melting temperature of the top layer. At least one of the plurality of inserts can melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

BRIEF DESCRIPTION OF THE DRAWINGS

The accompanying drawings are not necessarily intended to be drawn to scale. Like reference numbers and designations in the various drawings indicate like elements. For purposes of clarity, not every component may be labelled in every drawing. In the drawings.

DETAILED DESCRIPTION

Figure 1:
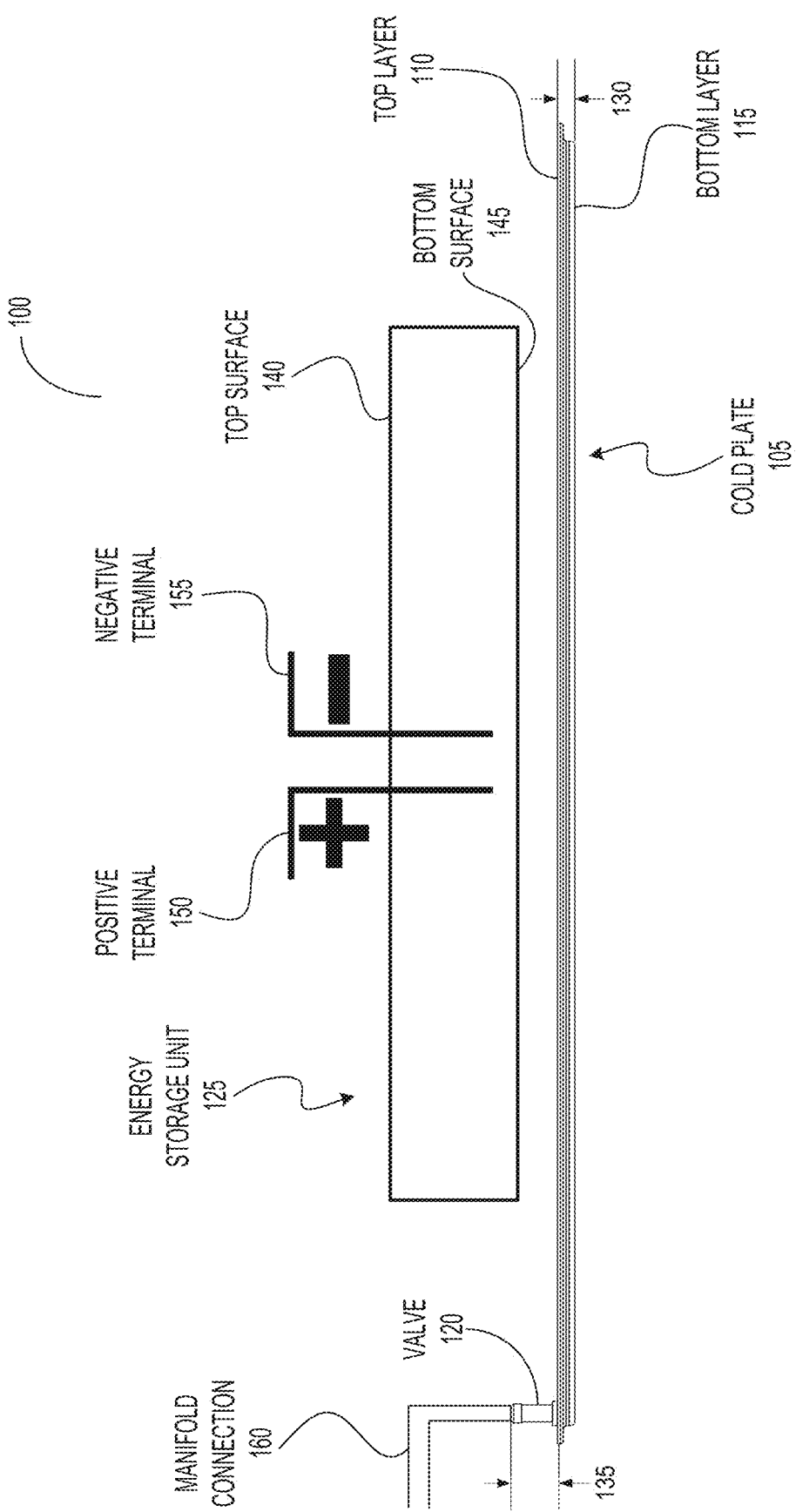
FIG. 1 depicts a side perspective view of an example cold plate of an energy storage cooling system.

Following below are more detailed descriptions of various concepts related to, and implementations of, methods, apparatuses, devices, and systems of temperature control for a battery pack or other energy storage device. The various concepts introduced above and discussed in greater detail below may be implemented in any of numerous ways.

Described herein are temperature control systems for battery packs in electric vehicles for an automotive configuration. An automotive configuration includes a configuration, arrangement or network of electrical, electronic, mechanical or electromechanical devices within a vehicle of any type. An automotive configuration can include battery cells for battery packs in electric vehicles (EVs). EVs can include electric automobiles, cars, motorcycles, scooters, passenger vehicles, passenger or commercial trucks, and other vehicles such as sea or air transport vehicles, planes, helicopters, submarines, boats, or drones. EVs can be fully autonomous, partially autonomous, or unmanned. EVs can include various components that run on electrical power. These various components can include an electric engine, an entertainment system (e.g., a radio, display screen, and sound system), on-board diagnostics system, and electric control units (ECUs) (e.g., an engine control module, a transmission control module, a brake control module, and a body control module), among other components.

Energy storage units (e.g., individual battery cells, battery packs each with cells, or battery modules with battery packs) can be installed in EVs to supply these various components with electrical power. To achieve proper operation, high-performance, and long life, the energy storage unit can be maintained in a temperature-controlled environment. One approach to protect against degradation and overheating can include cooling strips added to side walls of the energy storage units. Once inserted or added to the sidewalls, the cooling strips can draw or evacuate heat from the energy storage units. Another approach to prevent damage from heat can involve integrating cooling floors (e.g., a fan or heat sink) onto a bottom of energy storage units. A cooling floor can be used to extend or expand a surface area through which heat can dissipate from the energy storage unit.

Under both these approaches, however, the hardware components and infrastructure for the temperature control systems may not be readily replaceable or serviceable without disassembling or replacing the entire energy storage unit. Inability to readily replace or service an energy storage unit without disassembly can result in effectively limiting the integrity of the energy storage unit. Furthermore, while the two approaches can maintain the energy storage units in nominal, operational temperatures, these may fail against extreme temperature during thermal runaway events originating from the energy storage unit, such as ignition, fire, and explosion. This may be exacerbated, when multiple battery cells or packs are installed adjacent to another. In such configurations, if the thermal runaway condition is not contained, the thermal propagation may occur between adjacent battery packs or between different battery cells of the same battery pack. This can cause an overheat or thermal runaway condition to spillover to the adjacent battery cells or battery packs, potentially resulting in a catastrophic breakdown of the entire energy storage system. In EVs, the runaway effect may also lead to failure in other electric components.

To alleviate and address the drawbacks of these approaches in regulating temperature in energy storage units, modularly replaceable cold plates can be added or coupled to each electrical energy storage unit. The cold plates can be removed and replaced from the energy storage units with the other cold plates remaining in position. Each cold plate can include at least one of an inlet valve to receive coolant and an outlet valve to release liquids from the cold plate. The cold plates can include a burn-through design to protect against overheating at the module level. For example, the cold plates can be formed from thin metal designed to intentionally deform when exposed to excessive heat (e.g., a thermal runaway condition). The deformation can cause a portion of the cold plate to melt away, dissolve, retract, or open, so that coolant (e.g., fluid) can flow into the corresponding compartment associated with the overheat or thermal runaway condition. In this manner, the cold plates can limit or isolate effects of a thermal runaway condition affecting one of the battery cells, battery packs, or battery modules to just the affected battery packs, thereby preventing the effect from spreading to other battery cells, battery packs, or battery modules.

FIG. 1 depicts an example side view of a cold plate 105 of an energy storage environmental control system or apparatus 100. The apparatus 100 can include at least one cold plate 105. The cold plate 105 can include at least two layers, a top layer 110 and a bottom layer 115. The top layer 110 and the bottom layer 115 each can be formed of a thermally conductive material. The thermally conductive material for the top layer 110 and the bottom layer 115 can include a ceramic material (e.g., silicon nitride, silicon carbide, titanium carbide, zirconium dioxide, and beryllium oxide), a metal (e.g., aluminum, copper, iron, tin, lead, and various alloys), a thermoplastic material (e.g., acrylic glass, polyethylene, polypropylene, polystyrene, or polyvinyl chloride), among others. For example, the top layer 110 of the cold plate 105 can be a rigid, thermally conductive alloy such as 1000 series aluminum with a thermal conductivity greater than 200 W/m*K or 3000 series aluminum with a thermal conductivity greater than 150 W/m*K. The top layer 110 can also include an electrical insulation layer to separate a metallic portion of the top layer 110 from an electrically conductive component (e.g., a battery cell, battery pack, or battery module). The electrical insulation layer can be, for example, a thin e-coating such as JMC-700K with a thickness of 50-80 μm that passes 600-1000V isolation testing.

The top layer 110 and the bottom layer 115 can be in contact with each other. The top layer 110 can be at least partially flush with the bottom layer 115 (e.g., as depicted). Conversely, the bottom layer 115 can be at least partially flush with the top layer 110. The top layer 110 and the bottom layer 115 can form or define an encasing or a housing. The encasing defined by the top layer 110 and the bottom layer 115 can hold liquid, such as coolant. The encasing can correspond to a channel for directing liquid flow, e.g., of the coolant. A thickness 130 of the top layer 110 and the bottom layer 115 cold plate 105 can range from 10 mm to 20 cm. The thickness 130 can be set to account for coolant connections and any clearances around the manifold for tool access. The details of the structure and functionalities of the top layer 110 and the bottom layer 115 are provided below in conjunction with FIGS. 2-8.

The cold plate 105 can include at least one valve 120. The top layer 110 of the cold plate 105 can support or hold the at least one valve 120. The at least one valve 120 can be connected to at least one central manifold of the apparatus 100 via a manifold connection 160. The manifold connection 160 can include a fluid conveyance element (e.g., a hollow cylinder of a pipe) to provide coolant to the cold plate 105 and to release coolant from the cold plate 105. One central manifold can provide coolant into the cold plate 105 via the at least one valve 120. The coolant provided to the cold plate 105 can include a liquid or a gas. Examples of coolants can include water, antifreeze, polyalkylene glycol, liquid nitrogen, hydrofluorocarbons (HFCs), and perfluorocarbons (PFCs), among others. The central manifold, for example, can be enclosed in a U-channel through the midsection (and not on a peripheral side) of the battery pack, which facilitates installation and protection since the coolant (main) lines can share the midsection with an electrical bus.

One of the valves 120 can be an inlet valve and can allow the coolant to flow into the encasing (or channel) defined by the top layer 110 and the bottom layer 115 of the cold plate 105. Another central manifold can receive liquid (e.g., coolant) from the cold plate 105 via the at least one valve 120. The valves 120 can be throttle valves or can include throttles, levers, stoppers, or compressors to increase, decrease, or block the flow of fluid into and out of the cold plates 105. The valves 120 can operate independently of one another for each cold plate 105. The valve 120 can control a rate of flow of the coolant into the cold plate 105. The rate of flow can be controlled by a battery management unit. The rate of flow of the coolant into the cold plate 105 can range from 0 to 100 liters per minute. One of the valves 120 can be an outlet valve and can allow liquid to flow out of the encasing (or channel) defined by the top layer 110 and the bottom layer 115 of the cold plate 105. The valve 120 can control a rate of flow of the liquid out of the cold plate 105. The rate of flow can be controlled by the battery management unit. The rate of flow of the liquid released from the cold plate 105 can range from 0 to 100 liters per minute. The at least one valve 120 can be removably coupled with the central manifold (e.g., using a hose coupling). When the cold plate 105 or the energy storage unit 125 is to be serviced or otherwise replaced, the valve 120 of the cold plate 105 can be disconnected from the manifold connection 160. A height 135 of the valve 120 from a top surface of the top layer 110 can range from 20 mm to 15 cm. The height 135 of the at least one valve 120 can be set to account for coolant connections and any clearances around the manifold for tool access. Details of the functionality of the valve 120 in relation to the top layer 110 and the bottom layer 115 will be provided below in conjunction with FIGS. 2-8.

The apparatus 100 can include an energy storage unit 125. The energy storage unit 125 can reside in an electric vehicle, can power the electric vehicle, and can provide electrical energy to various components of the electric vehicle. The energy storage unit 125 can include at least one battery cell. The energy storage unit 125 can include a battery pack with a set of battery cells. The battery cells in the energy storage unit 125 can include a lithium-air battery cell, a lithium ion battery cell, a nickel-zinc battery cell, a zinc-bromine battery cell, a zinc-cerium battery cell, a sodium-sulfur battery cell, a molten salt battery cell, a nickel-cadmium battery cell, or a nickel-metal hydride battery cell, among others. The battery pack of the energy storage unit 125 can define or include one or more holders. Each holder can contain, support, or house at least one of the battery cells. The battery pack can include electrically insulative, but thermally conductive material around the holder for the battery cells. Examples of thermally conductive material for the battery pack can include a ceramic material (e.g., silicon nitride, silicon carbide, titanium carbide, zirconium dioxide, and beryllium oxide) and a thermoplastic material (e.g., acrylic glass, polyethylene, polypropylene, polystyrene, or polyvinyl chloride), among others.

The energy storage unit 125 can have a top surface 140 and a bottom surface 145. The top surface 140 can correspond to a top surface of the battery pack or individual battery cell of the energy storage unit 125. In addition, the bottom surface 145 can correspond to a bottom surface of the battery pack or an individual battery cell of the energy storage unit 125. The energy storage unit 125 can have or define at least one positive terminal 150 and at least one negative terminal 155. The at least one positive terminal 150 and the at least one negative terminal 155 can both be defined along the top surface 140 of the energy storage unit 125. The positive terminal 150 and the negative terminal 155 can be electrically coupled to various components of the electric vehicle. The bottom surface 145 of the energy storage unit 125 can face the top layer 110 of the cold plate 105, when coupled together to regulate temperature.

The cold plate 105 can be thermally coupled with an energy storage unit 125. To thermally couple the two components, the cold plate 105 can be positioned, arranged, or disposed adjacent or below the energy storage unit 125. At least the top layer 110 can be in contact with or flush with at least a portion of the bottom surface 145 of the energy storage unit 125. Conversely, at least the bottom surface 145 can be in contact or flush with at least a portion of the top layer 110 of the cold plate 105. For example, as depicted in FIG. 1, the cold plate 105 can be arranged below the energy storage unit 125, such that the bottom surface 145 of the energy storage unit 125 lies on a portion of the top layer 110 of the cold plate 105. At least the top layer 110 of the cold plate 105 can be thermally coupled with the bottom surface 145 of the energy storage unit 125. The top layer 110 of the cold plate 105 can be thermally coupled with the bottom layer 115 of the cold plate 105. In this manner, the bottom surface 145 of the energy storage unit 125 thermally coupled with the cold plate 105 can be opposite of the top surface 140 of the energy storage unit 125 defining both the positive terminal 150 and the negative terminal 155. The bottom layer 115 of the cold plate 105 can be thermally coupled with at least the bottom surface 145 of the energy storage unit 125 via the top layer 110.

The dimensions of the cold plates 105 can vary relative to dimensions of the energy storage unit 125. For example the size of the cold plate 105 can match a floor footprint of the energy storage unit 125, such as an entire battery pack, or of individual blocks, modules, or submodules of the battery pack. Further coolant connections via the valves 120 between the cold plates 105 and the main lines of the central manifold can be in series or in parallel. The cold plates 105 can also include walls or protrusions that extend up from the bottom floor of the battery pack to incorporate sidewall cooling of the battery pack or battery cells thereof.

The cold plate 105 can be removably attached, fastened, joined, or otherwise added to the bottom surface 145 of the energy storage unit 125. The top layer 110 of the cold plate 105 can define or include one or more holes to insert and secure a fastener element, such as a screw, bolt, a clasp, buckle, tie, or clip, among others. The bottom layer 115 of the cold plate 105 can also define or include one or more holes to insert and secure the fastener element. The bottom surface 145 of the energy storage unit 125 can also define or include one or more holes to insert and secure the fastener element. The holes of the bottom surface 145 of the energy storage unit 125 can align with the holes of the top layer 110 of the cold plate 105. The holes of the top layer 110 of the cold plate 105 can align with the holes of the bottom layer 115 of the cold plate 105. Once aligned, the fastener element can be inserted through the hole of the top layer 110 and the hole of the bottom surface 145 to attach the cold plate 105 to the bottom surface 145 of the energy storage unit 125. The fastener element can also be inserted through the hole of the bottom layer 115 prior to insertion through the hole of the top layer 110 and the hole of the bottom surface 145. For example, the cold plate 105 can be screwed onto the bottom surface 145 of the energy storage unit 125 at the defined positions. When the cold plate 105 or the energy storage unit 125 is to be serviced or otherwise replaced, the cold plate 105 can be unscrewed and thus removed from the energy storage unit 125. The top layer 110 of the cold plate 105 can also be joined to the bottom surface 145 of the energy storage unit 125 by applying an adhesive (e.g., acrylic polymer, polyurethane, polysiloxane, and epoxy). The modular cold plates 105 can disconnect and release from the main coolant lines for service, maintenance, or replacement. The cold plate 105 to cold plate 105 (e.g., module to module) interconnects can share the same space as the main coolant lines but can be contained within individual channels and can be isolated from the main coolant lines to facilitate packaging and serviceability of the cold plates 105.

Figure 2:
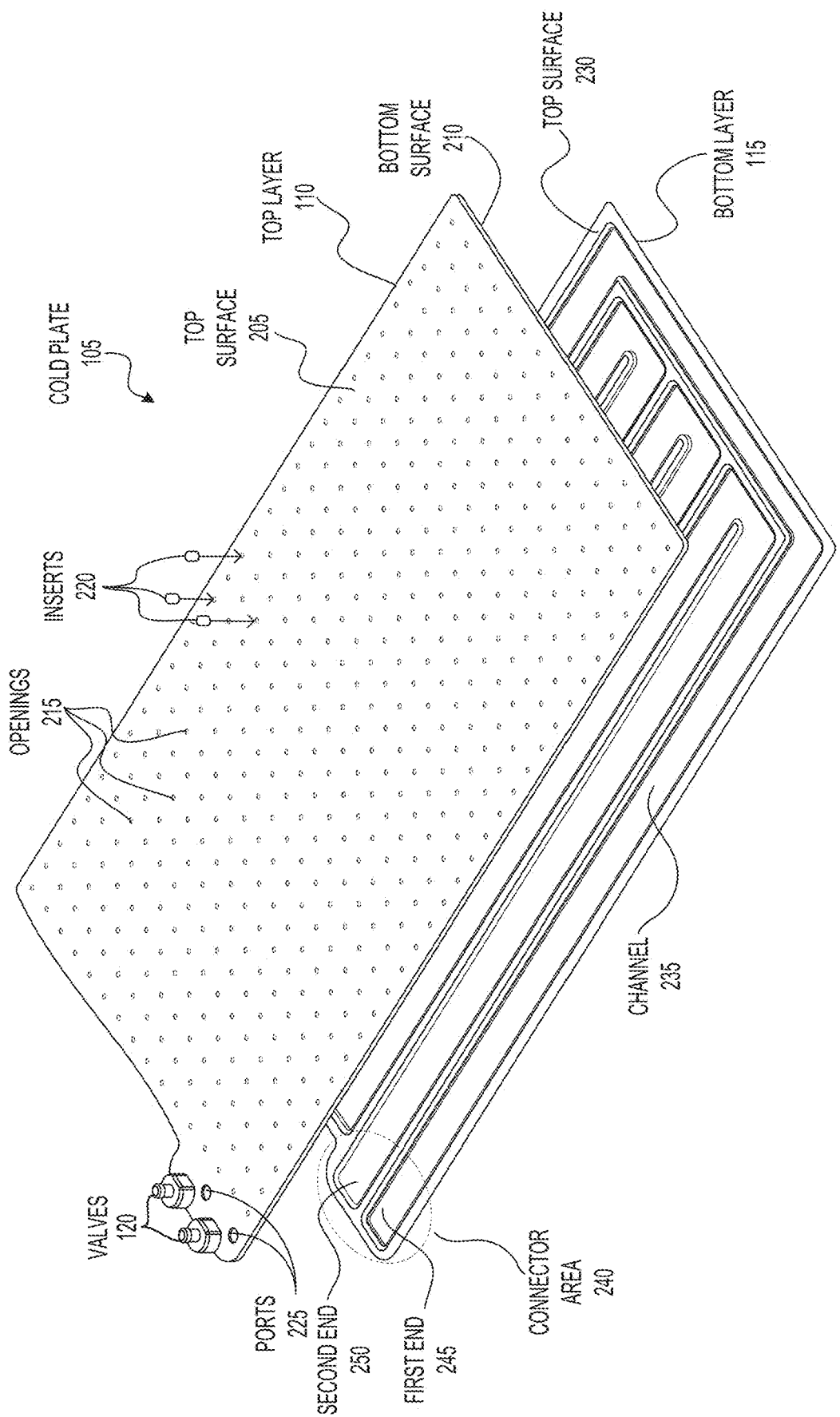
FIG. 2 depicts an exploded perspective view of an example cold plate of an energy storage cooling system.
Figure 3:
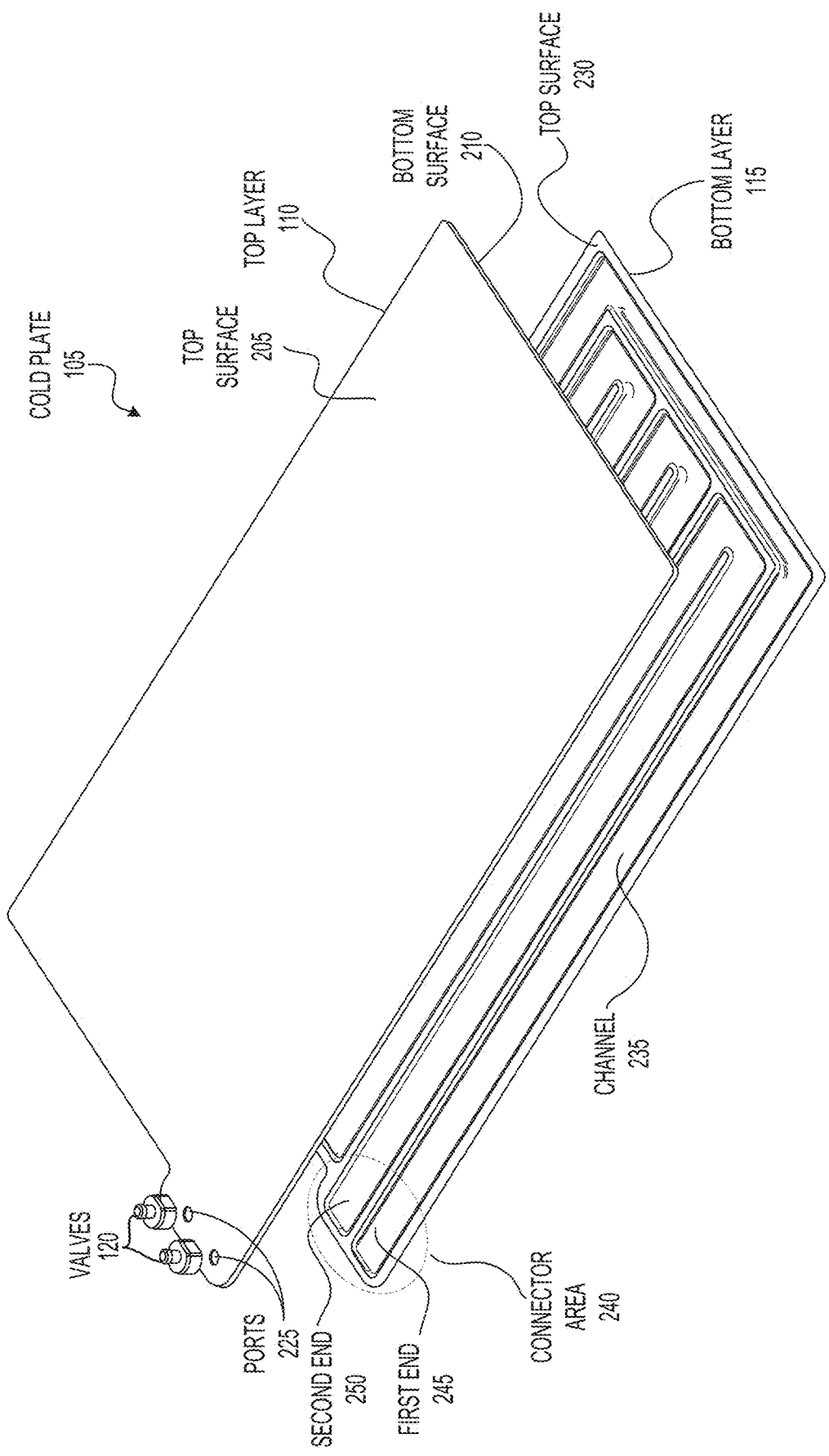
FIG. 3 depicts an exploded perspective view of an example cold plate of an energy storage cooling system.

FIGS. 2 and 3, among others, each depict an example exploded perspective view of the cold plate 105 of an energy storage cooling system. As shown, the isometric, exploded perspective view of the cold plate 105 reveals surfaces of the top layer 110 and the bottom layer 115 as well as the inner portion of the encasing formed by the top layer 110 and the bottom layer 115 of the cold plate 105. In this view, the energy storage unit 125 has been omitted, but as described above the bottom surface 145 of the energy storage unit 125 can be disposed above the top layer 110 of the cold plate 105 to be thermally coupled with the cold plate 105.

The top layer 110 of the cold plate 105 can have a top surface 205 and a bottom surface 210. The top surface 205 can correspond to a side of the top layer 110 of the cold plate 105 facing the bottom surface 145 of the energy storage unit 125. The bottom surface 210 can correspond to the opposite side of the top surface 205 of the top layer 110. The top surface 205 of the top layer 110 can be positioned, arranged, or otherwise disposed beneath the bottom surface 145 of the energy storage unit 125 to thermally couple the cold plate 105 with the energy storage unit 215. At least a portion of the top surface 205 can be flush with the bottom surface 145 of the energy storage unit 125. For example, bottom surface 145 of the energy storage unit 125 can span a part of the top surface 205 of the top layer 110. In this manner, heat from the energy storage unit 215 can be first absorbed by the top surface 205 of the top layer 110, and then transferred to the other parts of the cold plate 105.

The top layer 110 can define or include one or more openings 215 (as depicted in FIG. 2). The one or more openings 215 can be disposed, arranged, or otherwise defined along the top layer 110 in a symmetric pattern (e.g., with even spacing between each opening 215 as depicted in FIG. 2), an asymmetric pattern, in a random pattern, or in a quasi-random pattern. The openings 215 can be shaped to facilitate melting, beading, disintegration, or evaporation of the filler material inserted therein. Each opening 215 itself can be one of a variety of shapes, such as cylindrical (e.g., as depicted in FIG. 2), an opening conical, or prismatic with a polygonal base, such as a triangle, square, a rectangular, a pentagon, or a hexagon, for example. Each opening 215 can correspond to a space spanning through the top layer 110 from the top surface 205 to the bottom surface 210. Each opening 215 can have a width ranging 1 mm-25 mm, a length ranging 1 mm-25 mm, and a height ranging 0.2 mm-3 mm. The top layer 110 can also lack the openings 215 and the inserts 220, with the thermally conductive material spanning the entirety of the top layer 110 (e.g., as depicted in FIG. 3).

Each opening 215 defined along the top layer 110 can support, contain, or otherwise include an insert 220. Each insert 220 can plug, seal, or otherwise enclose the opening 215 that the insert 220 is added to. For example, the inserts 220 can be inserted to seal each opening 215 defined on the top layer 110 to achieve a watertight seal under pressure (e.g., as high as 150 psi). Once added, the one or more inserts 220 can prevent contents from within the cold plate 105 (e.g., within the encasing or channel) to directly physically contact the energy storage unit 125 disposed above the cold plate 105. Each insert 220 can correspond to a braised area of the top layer 110 at the opening 215. The braised area corresponding to the insert 220 can span from the top surface 205 to the bottom surface 210. The one or more inserts 220 can be comprised of thermally conductive material, such as tin or lead. The thermally conductive material for the inserts 220 can include a ceramic material (e.g., silicon nitride, silicon carbide, titanium carbide, zirconium dioxide, and beryllium oxide), a metal (e.g., aluminum, copper, iron, tin, lead, and various alloys), a thermoplastic material (e.g., acrylic glass, polyethylene, polypropylene, polystyrene, or polyvinyl chloride), among others. Each insert 220 can have a thermal expansion ratio larger than the top layer 110 to facilitate quicker melting than the surround top layer 110. Each insert 220 can have a melting temperature lower than a melting temperature of the top layer 110. For example, the melting temperature of the inserts 220 can range from 70° C. to 400° C., whereas the melting temperature of the top layer 110 can be 600° C. In examples where the inserts 220 correspond to braised areas along the top layer 110, the filler metal (e.g., copper alloy or aluminum alloy) used for the braised area can have a melting temperature lower than the top layer 110 of the cold plate 105. The dimensions of each insert 220 can match the dimensions of each opening 215. A length of each insert 220 can range from 1 mm-25 mm. A width of each insert 220 can range from 1 mm-25 mm. A height of the insert 220 can range from 0.2 mm-3 mm.

The top layer 110 can also define or include at least one port 225 (e.g., two ports 225 as depicted). The at least one port 225 can include an aperture or a hole spanning form the top surface 205 to the bottom surface 210 of the top layer 110. The at least one port 225 can be coupled or connected with the at least one valve 120 supported by the top surface 205 of the top layer 110. At least a bottom portion of the at least one valve 120 can be inserted or included into the at least one port 225. The at least one port 225 can be connected to at least one central manifold of the apparatus 100 via the valve 120. One manifold can provide coolant into the cold plate 105 through the at least one valve 120 corresponding to an inlet valve. The port 225 can be connected with the valve 120 corresponding to the inlet valve to allow coolant to flow into the cold plate 105. Another manifold can receive liquid from the cold plate 105 through the at least one valve 120 corresponding to an outlet valve, and through the connected port 225. The other port 225 can be connected with the valve 120 corresponding to the outlet valve to allow liquid (e.g., coolant) to flow out of the cold plate 105.

The bottom layer 115 can be positioned, arranged, or attached to at least a portion of the bottom surface 210 of the top layer 110 to cover a top surface 230 of the bottom layer 115. The bottom layer 115 can have or define a channel 235 spanning the top surface 230. The channel 235 can correspond to a groove, a divot, or a trench partially spanning the depth of the bottom layer 115 from the top surface 230. The channel 235 defined along the top surface 230 of the bottom layer 115 can be covered by at least the bottom surface 210 of the top layer 110. The shape of the trench for the channel 235 spanning the top surface 230 can be a prismatic hollowing with a triangular, rectangular, pentagonal, semi-elliptical (e.g., as depicted in FIGS. 2 and 3), and semi-circular base, among others. The bottom layer 115 can be attached or joined to the bottom surface 210 of the top layer 110 along a perimeter of the bottom layer 115.

The channel 235 can circulate the coolant received through the at least one valve 120 and the port 225 connected to the valve 120. As the cold plate 105 is thermally coupled with the energy storage unit 125, the coolant in the channel 235 can evacuate, remove, or otherwise transfer heat away from the energy storage unit 125. Initially, the coolant in the channel 235 can be prevented from direct physical contact with the bottom surface 145 of the energy storage unit 125 by the inserts 220 included in the openings 215 of the top layer 110. Furthermore, the coolant can be streaming or flowing into the channel 235 at a normal pressure from outside the cold plate 105 via the at least one valve 120. The channel 235 can receive the coolant at in at least one connector area 240 positioned generally below the at least one port 225 defined by the top layer 110 and the at least one valve 120 supported by the top layer 110. The connector area 240 itself can be located toward a corner of the bottom layer 115 (e.g., as depicted in FIGS. 2 and 3). The connector area 240 can also be located along one of the sides (e.g., left, right, top, or bottom) of the bottom layer 115. Within the connector area 240, the channel 235 can have a first end 245 and a second end 250. The first end 245 of the channel 235 can be positioned below one of the valves 120 and the corresponding port 225. The second end 250 of the channel 235 can be positioned below one of the valves 120 and the corresponding port 225. One of the first end 245 and the second end 250 can serve as an inlet to receive coolant into the channel 235 from the central manifold via the valve 120 corresponding to the inlet valve and the port 225 connected thereto. The other of the first end 245 and the second end 250 can serve as an outlet to release the liquid held in the channel 235 to the central manifold, e.g., via the valve 120 corresponding to the outlet valve and the port 225 connected thereto. For example, the first end 245 can be located beneath the valve 120 corresponding to the inlet valve to take in coolant from the central manifold connected to the valve 120 into the channel 235. Conversely, the second end 250 can be located beneath the valve 120 corresponding to the outlet valve to expel or release liquid (e.g., the coolant) from the channel 235 into the central manifold connected to the valve 120.

Figure 4:
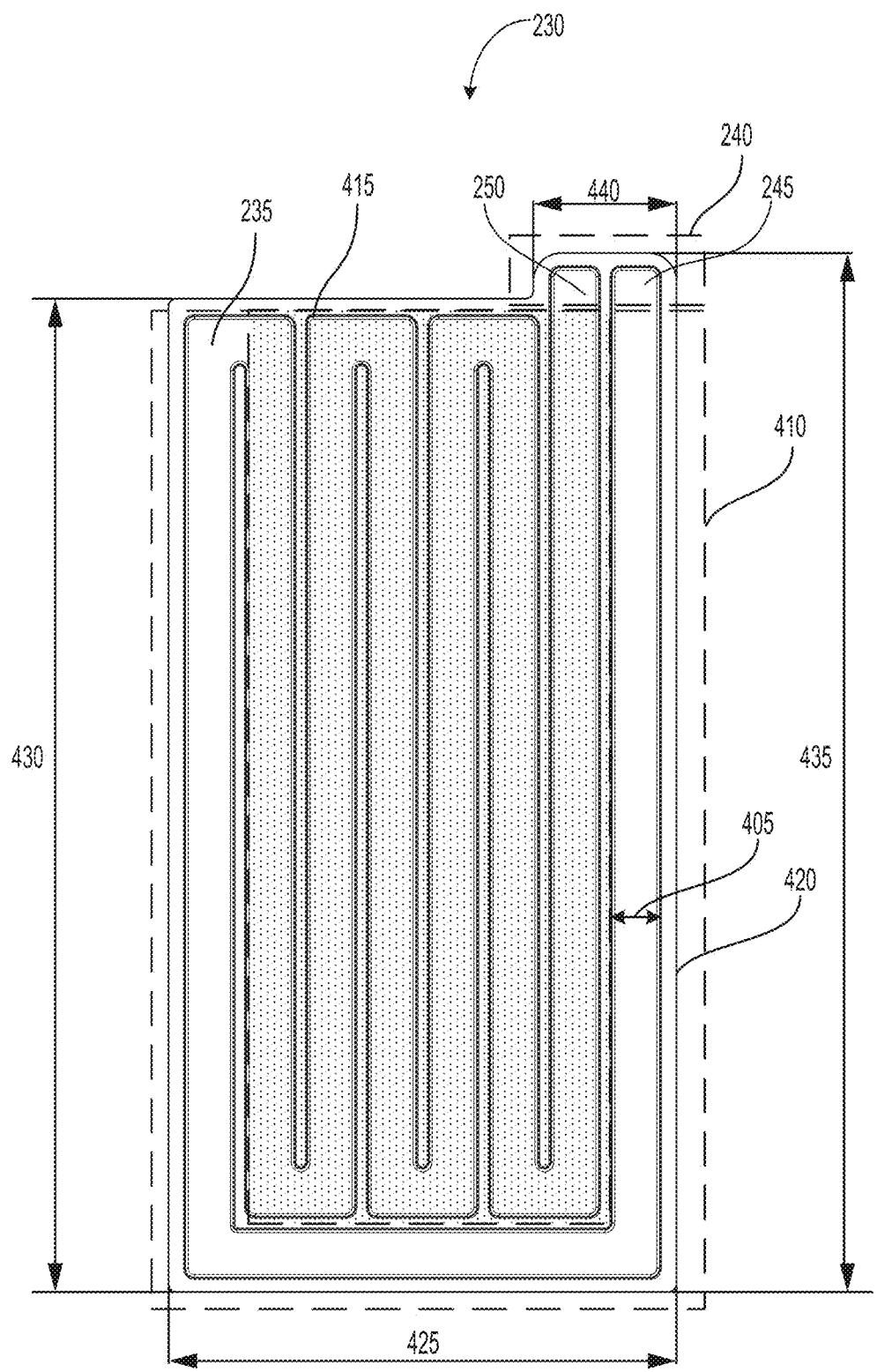
FIG. 4 depicts an overhead view of a bottom layer of an example cold plate of an energy storage cooling system.

FIG. 4, among others, depicts an example overhead (or top) view of the top surface 230 of bottom layer 115 of the cold plate 105 of an energy storage cooling system. The channel 235 defined on the top surface 230 of the bottom layer 115 can span lengthwise and widthwise across the top surface 230 (e.g., as depicted). The channel 235 can have a width 405 ranging between 3 mm-500 mm. The width 405 can be configured to be larger than a width or length (or diameter) of the openings 215 or the inserts 220. The bottom layer 115 of the cold plate 105 can have a width 425 ranging between 25 mm-1800 mm. The top surface 230 can have the connector area 240 protruding from the remaining portion of the top surface 230. For the portion excluding the connector area 240, the bottom layer 115 can have a length 430 ranging between 25 mm-2500 mm. For the portion including the connector area 240, the bottom layer 115 can have a length 435 ranging between 35 mm-2550 mm. The connector area 240 can have a width 440 of 15 mm-250 mm. The length 435 and the width 440 can be dependent on the dimensions of the at least one valve 120 and accommodation of any connections and clearances around the central manifold for tool access. The dimensions 425-440 can be the same for the top surface 205 or the bottom surface 210 of the cold plate 105. The channel 235 of the cold plate 105 can hold 0.1 to 2 liters of liquid (including the coolant).

The channel 235 can meander, traverse, span, or otherwise be defined starting from the first end 245 and terminating at the second end 250 along the top surface 230. The top surface 230 can also have an exterior area 410 and an interior portion 415 (shaded in dots in FIG. 4). The exterior area 410 can correspond to a portion of the top surface 230 generally along an outer perimeter 420 of the bottom layer 115 on three edges. The interior portion 415 can correspond to a portion of the top surface 230 covering generally a center of the top surface 230 and a portion of the top surface 230 along the remaining edge of the outer perimeter 420. In spanning the top surface 230 of the bottom layer 115, the channel 235 can have a straight path along the exterior area 410 and can have a circuitous path within at least the interior portion 415. The path of the channel 235 can start from the first end 245 in the connector area 240 and terminate at the second end 250 also in the connector area 240. The relatively straight path can include straight paths with three to five curves occurring at 45° or 90° angles. The circuitous path can include, for example, a zigzag pattern (e.g., as depicted in FIG. 4), a spiral shape, a loopy shape, a serpentine shape, among others. The path of the channel 235 from the first end 245 to the second end 250 can be non-intersecting (e.g., as depicted in FIG. 4). The path of the channel 235 can also intersect one or more times from the first end 245 to the second end 250. In this manner, the coolant can spread fairly evenly from the first end 245 to the second end 250, and move across the top surface 230 of the bottom layer 115. By spreading out the coolant, the heat from the energy storage unit 125 thermally coupled with the cold plate 105 can be spread over the top surface 230 via the coolant held in the channel 235 defined along the top surface 230.

Since the melting temperature of the inserts 220 is lower than the melting temperature of the top layer 110, the inserts 220 can melt away prior to deformation of the top layer 110 when the energy storage unit 125 applies or exerts heat onto the top surface 205 of the top layer 110. The inserts 220 can bead, break, disintegrate, or evaporate from the heat released from the energy storage unit 125 onto the top surface 205 of the top layer 110. The inserts 220 can also be forced open by pressure in the form of gas released from the energy storage unit 125 onto the top surface 205 of the top layer 110. The energy storage unit 125 can (e.g., due to thermal runaway or improper use) radiate a heat with temperature greater than the melting temperature of the inserts 220 or release pressure through a portion of the bottom surface 145 of the energy storage unit 125. For example, the energy storage unit 125 can undergo an thermal runaway event resulting in heat and pressure building up within. The temperature from the energy storage unit 125 can increase over time as the thermal runaway event creates more heat. As a result, at least one of the inserts 220 can melt away from the energy storage unit 125 heating the insert 220 to a temperature greater than the melting temperature of the insert 220. The affected inserts 220 can be below or near the portion of the bottom surface 145 through which the heat is radiating. The insert 220 can melt in response to exposure heat in a number of different ways. The insert 220 can melt into a bead deposited onto the top surface 205 of the top layer 110. The insert 220 can evaporate into gas when the temperature is greater than the melting temperature. The insert 220 can melt away with remnants dropping below into the channel 235 of the bottom layer 115. The remnants can be a liquefied form (or re-solidified form) of the insert 220, and can flow through the channel 235 defined by the top surface 230 of the bottom layer 115 and out through the valve 120 corresponding to the outlet valve to the central manifold. The joint between the affected insert 220 and the top layer 110 can also fail such that a controlled leak can form around the insert 220 allowing the entire insert 200 to fall into the channel 235. The joint can be a press fit that becomes loose due to thermal expansion or can be an adhesive that melts or otherwise loses strength during a thermal runaway event.

The melting of the insert 220 can expose the opening 215 defined by the top layer 110 surrounding or abutting the insert 220. The exposed opening 215 can allow a portion of the coolant contained within the channel 235 of the bottom layer 115 to release onto at least the bottom surface 145 of the energy storage unit 125. With the opening 215 exposed, the channel 235 of the bottom layer 115 can flood the coolant onto at least the bottom surface 145 of the energy storage unit 125. The coolant can be pushed by the pressure within the channel 235 to flow onto at least the bottom surface 145 of the energy storage unit 125 through the exposed opening 215. In applying pressure, the coolant can rise via the opening 215 and can be released onto the portion of the bottom surface 145 through which the heat is radiating to regulate the temperature of heating from the energy storage unit 125. The pressure exerted onto the coolant into the cold plate 105 can be same as the pressure applied prior to the exposure of the openings 215 can push the coolant through the exposed openings 215 to splash the coolant onto the portion of the energy storage unit 125. If the exposed opening 215 is aligned along an outer side wall or positioned outside the outer side wall of the energy storage unit 125, the coolant can also be released from the channel 235 through the exposed opening 215 and contact the outer side walls (and potentially other portions) of the energy storage unit 125. For example, by ascending the outer side walls, the coolant can come into contact even with the top surface 140 of the energy storage unit 125. In this manner, the coolant released by the exposed opening 215 can alleviate the heat from the energy storage unit 125 as well as lower temperature from the heating.

As the heat within the energy storage unit 125 builds up, the temperature can eventually exceed the melting temperature of the top layer 110 itself. At this point, the affected inserts 220 below or near the portion of the bottom surface 145 through which the heat is radiating may have already melted. Once the temperature is greater than the melting temperature of the top layer 110, a portion of the top layer 110 can partially deform or buckle from the heat applied by the energy storage unit 125. A portion of the top layer 110 near or around the portion of the bottom surface 145 of the energy storage unit 125 through which the heat is radiating can partially deform or buckle from heat. The portion of the top layer 110 can correspond to a hole through the top surface 205 to the bottom surface 145, thereby exposing a portion of the channel 235 of the bottom layer 115. When the top layer 110 deforms, more of the coolant contained in the channel 235 of the bottom layer 115 can be released onto the bottom surface 145 of the energy storage unit 125. The coolant can be pushed by the pressure within the channel 235 to flow onto at least the bottom surface 145 of the energy storage unit 125 through the exposed opening 215. In applying pressure, the coolant can rise via the deformed portion of the top layer 110 and can be released onto the portion of the bottom surface 145 through which the heat is radiating to regulate the temperature of heating from the energy storage unit 125. In this manner, more coolant can be released from the channel 235 to alleviate and absorb the heat from the energy storage unit 125.

An external battery management system (BMS) can also set and maintain a flow rate of the coolant into the cold plate 105 by controlling the at least one valve 120. The BMS can acquire measurements of temperature and pressure exerted from the energy storage unit 125 as well as a current flow rate and a pressure of the coolant into the cold plate 105. The BMS can adjust the at least one valve based on the measured flow rate or the pressure of the coolant into the cold plate 105 to maintain a normal pressure. When the BMS detects that the energy storage unit 125 is undergoing a thermal runaway event based on temperature or pressure readings, the BMS can increase the flow rate of the coolant into the cold plate 105 by opening the at least one valve 120. The BMS can further increase the pressure and flow rate of the coolant, when the top layer 110 of the cold plate 105 buckles from the heat, thereby allowing more coolant to flow into the affect cold plate 105. In this manner, more coolant can be provided by the BMS to the cold plate 105 and through the now exposed openings 215 to cool the bottom surface 145 of the energy storage unit 125.

Figure 5:
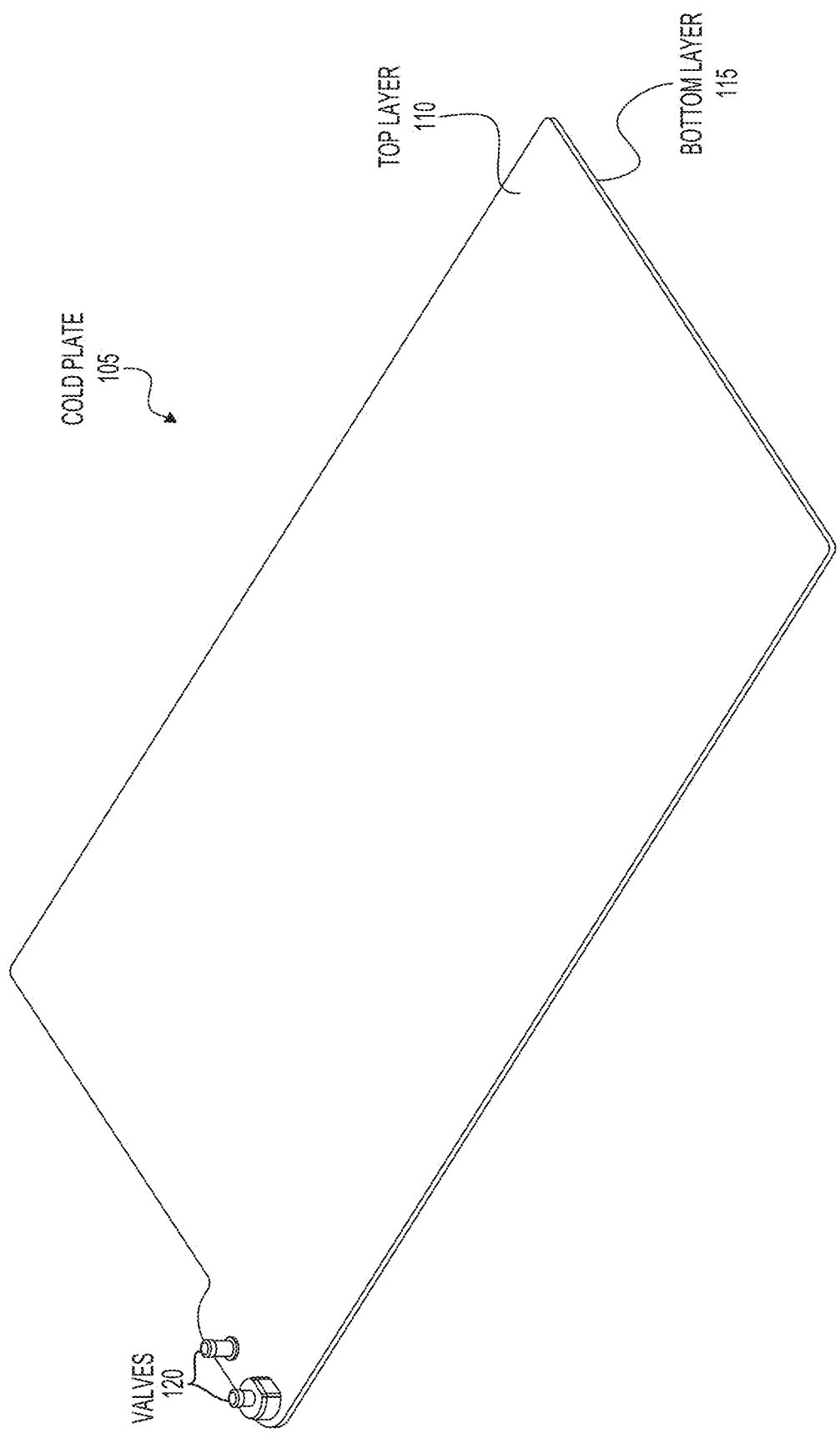
FIG. 5 depicts an isometric view of an example cold plate of an energy storage cooling system.

FIG. 5, among others, depicts an example isometric view of the cold plate 105 of an energy storage cooling system. In the illustrated example, the cold plate 105 can have one inlet valve 120 and can lack an outlet valve 120. This design can utilize an independent open loop temperature control of only the inlet valve 120 to a single cold plate 105. For example, if only coolant flow into the cold plate 105 is used for temperature control, a single valve, inlet controlled cold plate design can be sufficient and can decreases associated hardware and computational control costs.

Figure 6:
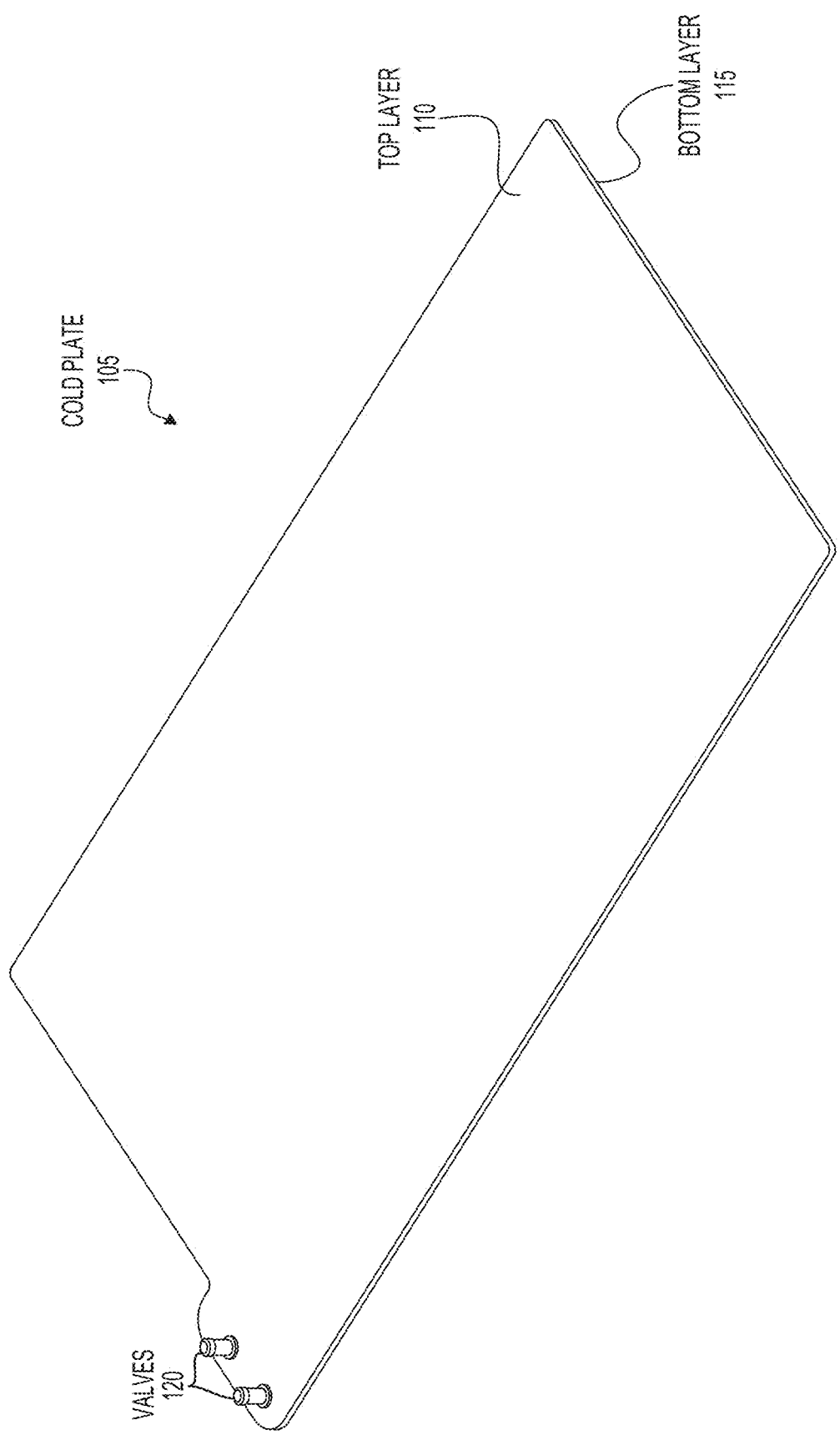
FIG. 6 depicts an isometric view of an example cold plate of an energy storage cooling system.

FIG. 6, among others, depicts an example isometric view of the cold plate 105 of an energy storage cooling system. In the illustrated example, the cold plate 105 can lack both inlet and outlet valves 120. This design can lack independent temperature control of each cold plate 105, by relying on the coolant flow from the manifold connection 160. The coolant can flow in and out of the cold plate 105 without any independent control (that is local at the cold plate 105), other than pressure from the central manifold of the apparatus 100 via the manifold connection 160.

Figure 7:
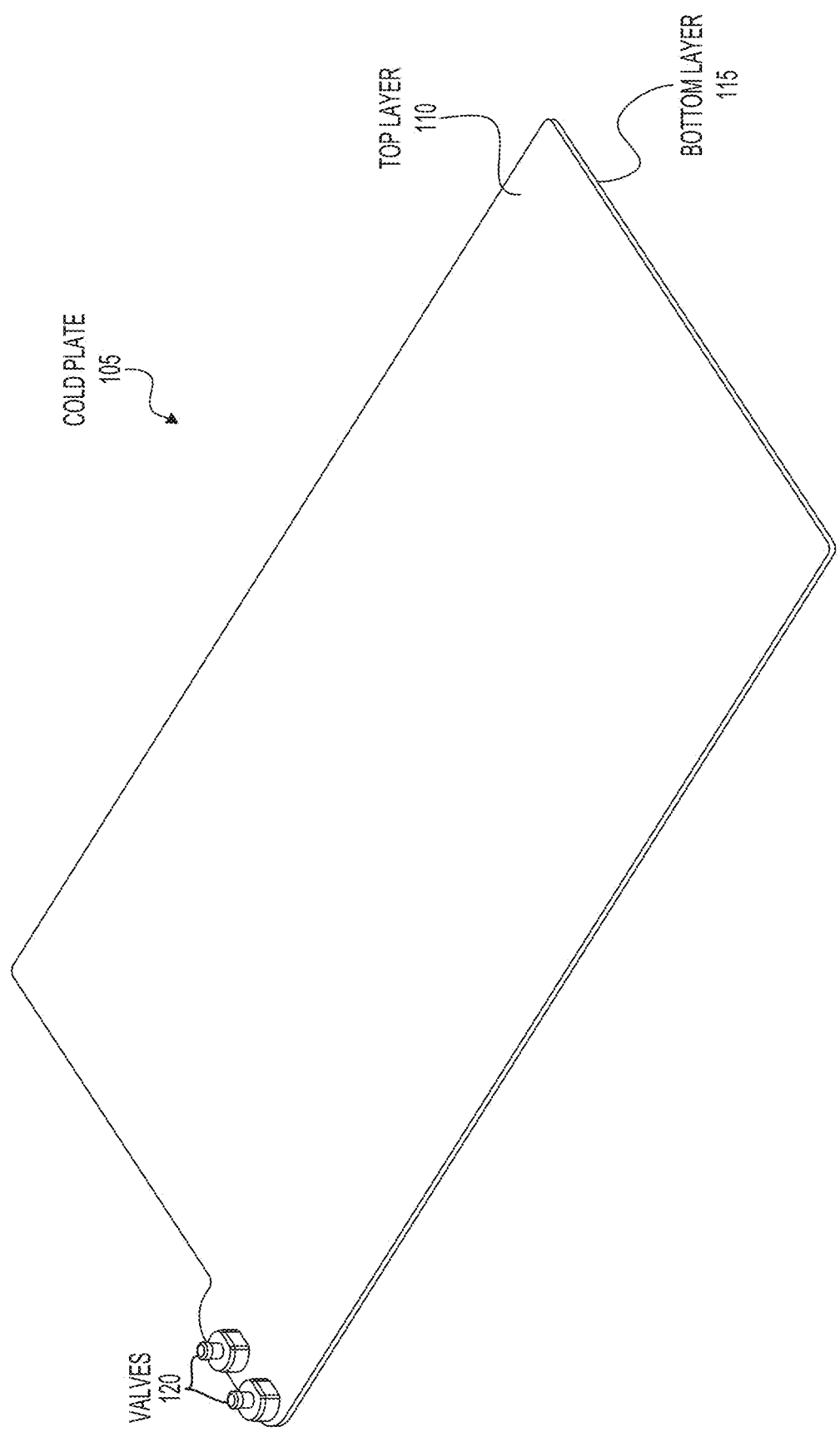
FIG. 7 depicts an isometric view of an example cold plate of an energy storage cooling system.

FIG. 7 depicts an example isometric view of the cold plate 105 of an energy storage cooling system. In the illustrated example, the cold plate 105 can have both an inlet valve 120 and an outlet valve 120. This design can utilize independent temperature control that controls coolant flow into the cold plate 105 and out of the cold plate 105. The temperature control for the cold plate 105 can be particularized to the cold plate 105, and can differ among cold plates 105 thermally coupled with energy storage units 125. The inlet valve 12 can control the coolant flow to affect and control the temperature of the cold plate. In addition, the outlet valve 120 can be opened during certain conditions (e.g., normal operations at temperatures below 120° C.) for coolant to freely flow out of the cold plate 105. The outlet valve 120 can also be partially or completely closed to stop flow from entering into the main manifold or to restrict back flow.

Figure 8:
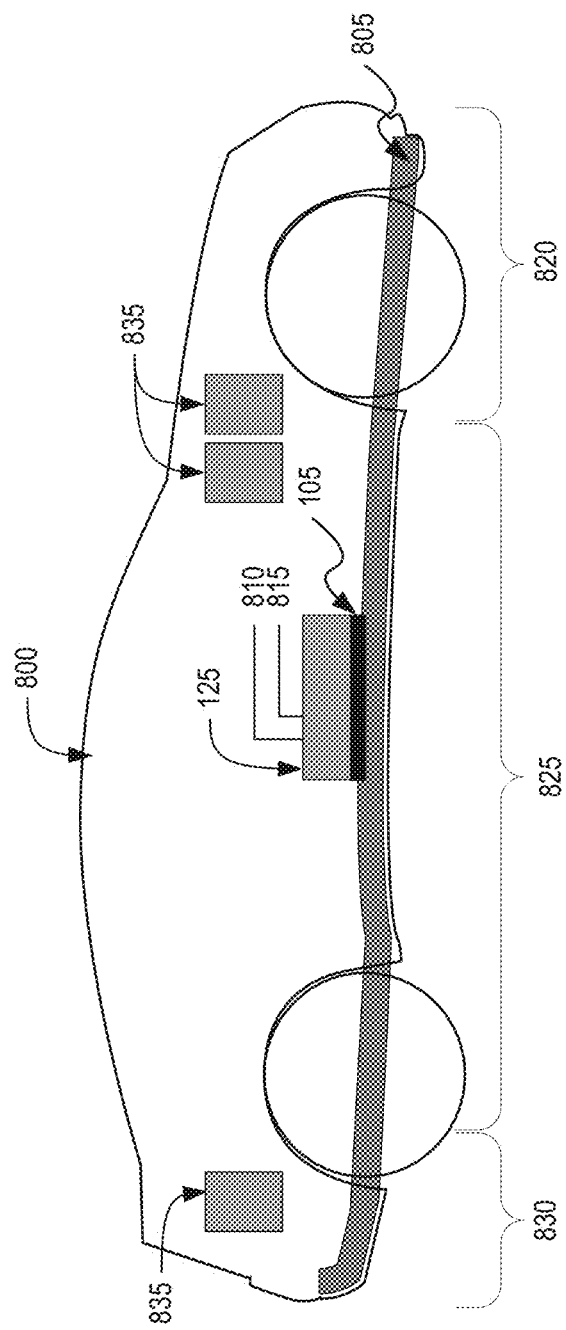
FIG. 8 is a block diagram depicting a cross-sectional view of an example electric vehicle installed with a battery pack.

FIG. 8 depicts a cross-section view of an electric vehicle 800 installed with an energy storage unit 125. The electric vehicle 800 can include a chassis 805 (e.g., a frame, internal frame, or support structure). The chassis 805 can support various components of the electric vehicle 800. The chassis 805 can span a front portion 820 (e.g., a hood or bonnet portion), a body portion 825, and a rear portion 830 (e.g., a trunk portion) of the electric vehicle 800. The one or more energy storage units 125 and the cold plates 105, and can be installed or placed within the electric vehicle 800. The one or more energy storage units 125 and the cold plates 105 can be installed on the chassis 805 of the electric vehicle 800 within the front portion 820, the body portion 825 (as depicted in FIG. 8), or the rear portion 830. The energy storage unit 125 can provide electrical power to one or more other components 835 (e.g., a motor, lights, radio, door, hood, or trunk opening, or other functionality) by electrically coupling with at least one positive current collector 810 (sometimes referred herein as a positive busbar) and at least one negative current collector 815 (sometimes referred herein as a negative busbar). The positive current collector 810 can be electrically coupled with the positive terminal 150 of the energy storage unit 125. The negative current collector 815 can be electrically coupled with the negative terminal 155 of the energy storage unit 125. The one or more components 835 can include an electric engine, an entertainment system (e.g., a radio, display screen, and sound system), on-board diagnostics system, and electric control units (ECUs) (e.g., an engine control module, a transmission control module, a brake control module, and a body control module), among others.

Figure 9:
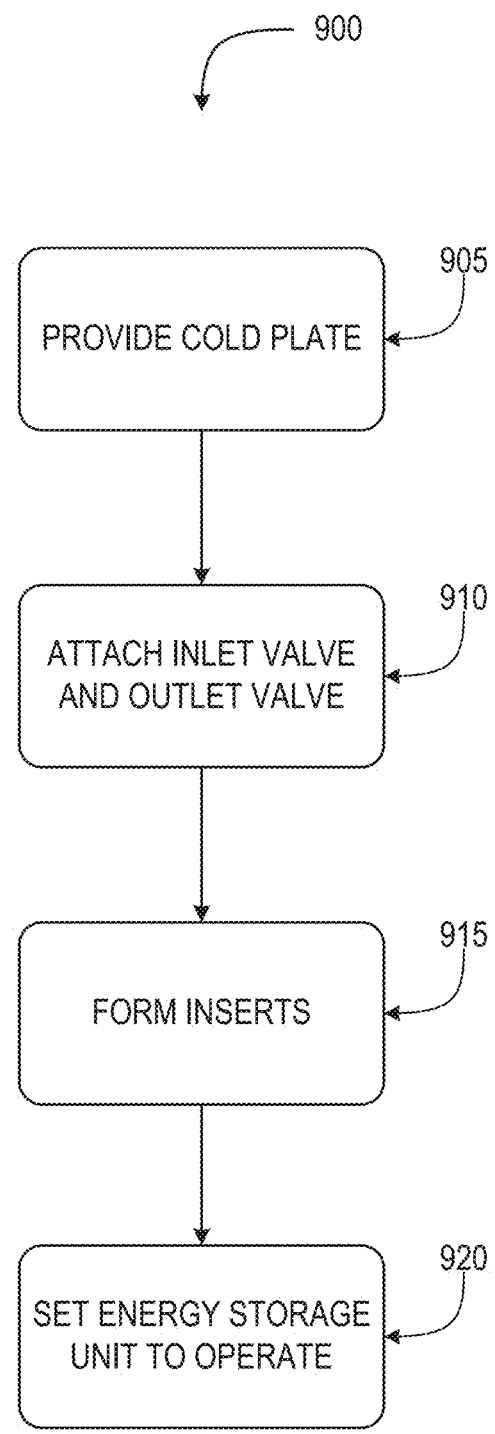
FIG. 9 depicts a flow diagram for an example method for cooling an energy storage system.

FIG. 9 depicts an example flow diagram for a method 900 of cooling an energy storage system. The method 900 can be implemented using any of the components detailed herein in conjunction with FIGS. 1-8. The method 900 can include providing or assembling a cold plate 105 (ACT 905). The cold plate 105 can include the top layer 110 layer and the bottom layer 115. The top layer 110 can be attached to the bottom layer 115 to form an encasing therein. The top layer 110 can cover the channel 235 defined along the top surface 230 of the bottom layer 115. The channel 235 can span across the top surface 230 of the bottom layer 115 to hold the coolant. The cold plate 105 can be thermally coupled with the energy storage unit 125. The top surface 205 of the top layer 110 can be positioned, arranged, or otherwise disposed beneath the bottom surface 145 of the energy storage unit 125.

The method 900 can include attaching an inlet valve 120 and an outlet valve 120 (ACT 910). At least one valve 120 can be attached or included onto the cold plate 105. The inlet valve 120 can control a rate of flow of coolant into the channel 235 spanning across the top surface 230 of the bottom layer 115. The outlet valve 120 can control a rate of flow of the liquid out of the channel 235 defined along the top surface 230 of the bottom layer 115. The cold plate 105 can include none, one, or two valves 120 to control flow rates. The inlet valve 120 and the outlet valve 120 can be positioned above the connector area 240. The connector area 240 can include the first end 245 and the second end 250 of the channel 235 of the bottom layer 115.

The method 900 can include forming inserts onto the cold plate 105 (ACT 920). The top layer 110 can define a plurality of openings 215. Each opening 215 can span or extend from the top surface 205 to the bottom surface 210 of the top layer 110. Each opening 215 can include or support an insert 220. The inserts 220 can be inserted or plugged into each opening 215 with a press, an adhesive, brazing, or welding. The braised areas on the top layer 110 or the inserts 220 can also be cut, punched, or otherwise defined along the top surface 205 and the bottom surface 210 of the top layer 110 via laser cutting, water jetting, machining, stamping, or forming. Each insert 220 can plug, seal, or otherwise enclose the opening 215. The inserts 220 can also correspond to braised areas of the top layer 110. The inserts 220 can have a melting temperature lower than a melting temperature of the top layer 110. The insert 220 (e.g., of length that is less than the thickness of the top layer 110, or of volume that is less than that defined within an opening 215) can partially fill the volume defined within the opening 215. The insert 220 (e.g., of length that is greater than the thickness of the top layer 110, or of volume that is greater than that defined within an opening 215) can completely fill the volume defined within the opening 215.

The method 900 can include setting the energy storage unit 125 to operate (ACT 925). The heat applied onto the top surface 205 of the top layer 110 can result in a temperature greater than the temperature of the inserts 220 in the openings 215 of the top layer 110. As a result, the inserts 220 in the top layer 110 can melt away, bead, disintegrate, or evaporate, prior to melting of the top layer 110 itself. The inserts 220 in the top layer 110 can also be pushed into the bottom layer 115 from the pressure exerted from the energy storage unit 125. When the insert 220 melts away or is pushed into the bottom layer 115, the opening 215 can be exposed. Through the opening 215, coolant held within the channel 235 of the bottom layer 115 can flow into the at least the bottom surface 145 of the energy storage unit 125, thereby alleviating the heating.

Figure 10:
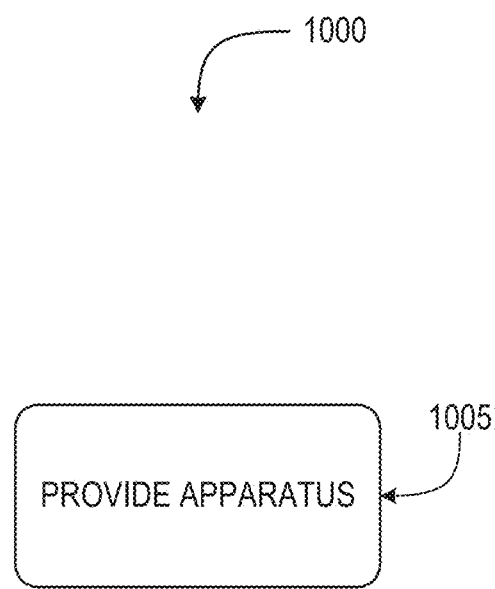
FIG. 10 depicts a flow diagram for an example method of providing an apparatus to control or interface with energy storage units.

FIG. 10 depicts an example method 1000. The method can include providing an apparatus 100 to control electrical energy storage units 125 in electric vehicles 800 (ACT 1005). The apparatus 100 can include at least one cold plate 105 disposed in an electric vehicle 800 and thermally coupled with at least one energy storage unit 125. The energy storage unit (e.g., a battery pack) 125 can power the electric vehicle 800. The cold plate 105 can include a bottom layer 115 having a channel 235 spanning across a top surface of the bottom layer 115. The channel 235 can circulate coolant to transfer heat away from the energy storage unit 125. The channel 235 can have a first end and a second end both located toward a corner of the bottom layer 115.

The cold plate 105 can have a top layer 110 to cover the channel 235 spanning across the top surface of the bottom layer 115. The top layer 110 can have a surface at least partially flush with a bottom surface of the energy storage unit 125 and defining a plurality of openings 215 each extending between the top surface and the bottom surface. The cold plate 105 can include a plurality of inserts 220 to seal the plurality of openings 215 and to prevent the coolant in the channel 235 from direct physical contact with the bottom surface of the energy storage units 125. The plurality of inserts 220 can have a melting temperature lower than a melting temperature of the top layer 110. At least one of the plurality of inserts 220 can melt to expose at least one of the plurality of openings 215. For example the bottom surface of the energy storage unit 125 can heat during operation to a point at or above the melting point of the inserts 220. This heat can transfer to the inserts 220 and can cause at least one of the inserts 220 to reach its melting temperature, causing at least one insert 220 to melt, open, or otherwise expose the opening 215 where the insert 220 is disposed. Exposure of the opening 215 can cause a release of at least a portion of the coolant from the channel 235 to at least the bottom surface of the energy storage unit 125. This can cool the energy storage unit 125.

While operations may be depicted in the drawings or described in a particular order, such operations are not required to be performed in the particular order shown or described, or in sequential order, and all depicted or described operations are not required to be performed. Actions described herein can be performed in different orders.

Having now described some illustrative implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed in connection with one implementation are not intended to be excluded from a similar role in other implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can include implementations including a plurality of these elements, and any references in plural to any implementation or element or act herein can include implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation or embodiment, and references to "an implementation," "some implementations," "one implementation" or the like are not necessarily mutually exclusive and are intended to indicate that a particular feature, structure, or characteristic described in connection with the implementation may be included in at least one implementation or embodiment. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms. Further, a reference to "at least one of 'A' and 'B'" can include only 'A', only 'B', as well as both 'A' and 'B'. Such references used in conjunction with "comprising" or other open terminology can include additional items.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

The systems and methods described herein may be embodied in other specific forms without departing from the characteristics thereof. The foregoing implementations are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. An apparatus to control electrical energy storage units in electric vehicles, comprising:
    a cold plate disposed in an electric vehicle and thermally coupled with an energy storage unit to power the electric vehicle, the cold plate including:
        a bottom layer having a channel spanning across a top surface of the bottom layer, the channel to circulate coolant to transfer heat away from the energy storage unit, the channel having a first end and a second end both located toward a corner of the bottom layer;
        a top layer to cover the channel spanning across the top surface of the bottom layer, the top layer having a surface at least partially flush with a bottom surface of the energy storage unit and defining a plurality of openings each extending between the top surface and the bottom surface;

a plurality of inserts to seal the plurality of openings and to prevent the coolant in the channel from direct physical contact with the bottom surface of the energy storage units, the plurality of inserts having a melting temperature lower than a melting temperature of the top layer, at least one of the plurality of inserts to melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

2. The apparatus of claim 1, comprising:
the first end to receive the coolant into the channel through a first port;
the second end to expel liquid from the channel through a second port, the liquid including at least the coolant; and
at least one of:
   an inlet valve connected with the first port of the first end to control a rate of flow of the coolant into the channel; and
   an outlet valve connected with the second port of the second end to control a rate of flow of the liquid out of the channel.

3. The apparatus of claim 1, comprising:
the bottom layer having four edges that define a perimeter for the bottom layer, the channel starting from the first end along at least three edges of the perimeter and terminating at the second end.

4. The apparatus of claim 1, comprising:
the bottom layer having an exterior portion along a bottom surface of the bottom layer, and an interior portion along the top surface, the channel having a circuitous path in at least the interior portion along the top surface.

5. The apparatus of claim 1, comprising:
the channel of the bottom layer having one or more directional changes between the first end and the second end spanning across the top surface of the bottom layer.

6. The apparatus of claim 1, comprising:
the channel of the bottom layer having a width larger than a dimension of each of the plurality of openings.

7. The apparatus of claim 1, comprising:
the channel of the bottom layer to flood the portion of the coolant into the at least the bottom surface of the energy storage unit via the at least one of the plurality of inserts to cool the energy storage unit.

8. The apparatus of claim 1, comprising:
the top layer to at least partially deform responsive to the bottom surface of the energy storage unit heating the surface of the top layer to the melting temperature of the top layer subsequent to the melting of at least one of the plurality of inserts.

9. The apparatus of claim 1, comprising:
at least one of the plurality of inserts to drop into the channel of the bottom layer responsive to exposure to heat from the bottom surface of the energy surface at least reaching a melting temperature of the plurality of inserts.

10. The apparatus of claim 1, comprising:
at least one of the plurality of inserts to melt into a bead deposited on the top layer responsive to exposure to heat from the bottom surface of the energy surface at least reaching a melting temperature of the plurality of inserts.

11. The apparatus of claim 1, comprising:
the plurality of openings arranged in a pattern on the top layer, the pattern including at least one of a symmetric pattern, an asymmetrical pattern, and a quasi-random pattern.

12. The apparatus of claim 1, comprising:
the bottom layer having a first area and a second area, the channel spanning across both the first area and the second area, the second area having a dimension greater than a dimension of the first area, the corner located in the second area extending beyond the first area.

13. The apparatus of claim 1, comprising:
the cold plate thermally coupled with the bottom surface of the energy storage unit opposite of a top surface of the energy storage unit where a positive terminal and a negative terminal of the energy storage unit are located.

14. The apparatus of claim 1, comprising:
the cold plate removably coupled to the bottom surface of the energy storage unit and to a central manifold for providing coolant to the channel of the bottom layer.

15. The apparatus of claim 1, comprising:
the cold plate having a thickness ranging between 20 mm to 12 cm, a width ranging between 5 cm to 150 cm, and a length between 60 cm to 120 cm.

16. A method of controlling electrical energy storage units in electric vehicles, comprising:
providing a cold plate in an electric vehicle to thermally couple with an energy storage unit for powering the electric vehicle, the cold plate having:
   a bottom layer having a channel spanning across a top surface of the bottom layer, the channel to circulate coolant to transfer heat away from the energy storage unit, the channel having a first end and a second end both located toward a corner of the bottom layer;
   a top layer to cover the channel spanning across the top surface of the bottom layer, the top layer having a surface at least partially flush with a bottom surface of the energy storage unit and defining a plurality of openings each extending between the top surface and the bottom surface;
   a plurality of inserts to seal the plurality of openings and to prevent the coolant in the channel from direct physical contact with the bottom surface of the energy storage units, the plurality of inserts having a melting temperature lower than a melting temperature of the top layer, at least one of the plurality of inserts to melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

17. The method of claim 16, comprising:
providing the cold plate including the channel of the bottom layer to flood the portion of the coolant into the at least the bottom surface of the energy storage unit via the at least one of the plurality of inserts to cool the energy storage unit.

18. The method of claim 16, comprising:
providing the cold plate including:
   the channel of the bottom layer having a first port on the first end to receive the coolant into the channel and a second port on the second end to expel liquid from the channel, the liquid including at least the coolant; and at least one of:
an inlet valve connected with the first port of the first end to control a rate of flow of the coolant into the channel; and
an outlet valve connected with the second port of the second end to control a rate of flow of the liquid out of the channel.

19. An electric vehicle, comprising:
one or more electric components;
a plurality of energy storage units for powering the one or more electric components;
a cold plate thermally coupled with each energy storage unit of the plurality of energy storage units, having:
a bottom layer having a channel spanning across a top surface of the bottom layer, the channel to circuit coolant to transfer heat away from the energy storage unit, the channel having a first end and a second end both located toward a corner of the bottom layer;
a top layer to cover the channel spanning across the top surface of the bottom layer, the top layer having a surface at least partially flush with a bottom surface of the energy storage unit and defining a plurality of openings each extending between the top surface and the bottom surface;
a plurality of inserts to seal the plurality of openings and to prevent the coolant in the channel from direct physical contact with the bottom surface of the energy storage units, the plurality of inserts having a melting temperature lower than a melting temperature of the top layer, at least one of the plurality of inserts to melt to expose at least one of the plurality of openings responsive to the bottom surface of the energy storage unit heating the at least one of the plurality of inserts to the melting temperature of the plurality of inserts to allow release of a portion of the coolant from the channel to at least the bottom surface of the energy storage unit.

20. The electric vehicle of claim 19, comprising:
the channel of the bottom layer having one or more directional changes between the first end and the second end spanning across the top surface of the bottom layer.

* * * * *